(12) United States Patent
Okabe (10) Patent No.: US 8,906,471 B2
(45) Date of Patent: Dec. 9, 2014

(54) METHOD OF DEPOSITING METALLIC FILM BY PLASMA CVD AND STORAGE MEDIUM

(75) Inventor: Shinya Okabe, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 1108 days.

(21) Appl. No.: 12/934,420

(22) PCT Filed: Mar. 25, 2009

(86) PCT No.: PCT/JP2009/055885
§ 371 (c)(1),
(2), (4) Date: Dec. 10, 2010

(87) PCT Pub. No.: WO2009/119627
PCT Pub. Date: Oct. 1, 2009

(65) Prior Publication Data
US 2011/0086184 A1    Apr. 14, 2011

(30) Foreign Application Priority Data
Mar. 28, 2008    (JP) .................................. 2008-087652

(51) Int. Cl.
*C23C 16/00* (2006.01)
*C23C 16/44* (2006.01)
*C23C 16/50* (2006.01)

(52) U.S. Cl.
CPC ............. *C23C 16/4404* (2013.01); *C23C 16/50* (2013.01); *C23C 16/4405* (2013.01)
USPC ......................................................... 427/569

(58) Field of Classification Search
CPC   C23C 16/06; C23C 16/4404; C23C 16/4405; C23C 16/45; C23C 16/50; C23C 16/568
See application file for complete search history.

(56) References Cited

U.S. PATENT DOCUMENTS

2005/0136657 A1* 6/2005 Yokoi et al. ................... 438/680

FOREIGN PATENT DOCUMENTS

| CN | 1547624 A | 11/2004 |
|----|-----------|---------|
| JP | 2004-96060 A | 3/2004 |
| JP | 2007-165479 A | 6/2007 |
| JP | 2007165479 A * | 6/2007 |
| TW | 200745370 A | 12/2007 |
| WO | 2004/007795 A1 | 1/2004 |
| WO | 2007/069599 A1 | 6/2007 |

OTHER PUBLICATIONS

Machine Language translation of JP 2007-165479.*
International Search Report for Application No. PCT/JP2009/055885 with English translation mailed Jun. 30, 2009.

* cited by examiner

*Primary Examiner* — David Turocy
(74) *Attorney, Agent, or Firm* — Abelman, Frayne & Schwab (57) ABSTRACT

For depositing a metallic film, the following steps are repeatedly conducted: a step in which a precoat film is formed on the inside of a chamber; a step in which two or more substrates to be treated are subjected to the deposition of a metallic film thereon by introducing each substrate into the precoated chamber, placing the substrate on the stage, feeding a treating gas while heating the substrate to generate a plasma of the treating gas, and depositing a metallic film on the substrate by plasma CVD; and a step in which after the film deposition on the substrates has been completed, a cleaning gas is introduced into the chamber to conduct dry cleaning. In the step in which two or more substrates to be treated are subjected to the deposition of a metallic film thereon, a conductive film is formed on the stage one or more times in the course of the step.

8 Claims, 5 Drawing Sheets

Case 3

FIG. 12

Case 4

METHOD OF DEPOSITING METALLIC FILM BY PLASMA CVD AND STORAGE MEDIUM

This is a U.S. national stage application of International Application No. PCT/JP2009/055885, filed on 25 Mar. 2009. Priority under 35 U.S.C. §119(a) and 35 U.S.C. §365(b) is claimed from Japanese Application No. JP2008-087652, filed 28 Mar. 2008, the disclosure of which is also incorporated herein by reference.

FIELD OF INVENTION

The present invention relates to a method of depositing a metallic film by CVD in a chamber, and memory medium.

BACKGROUND OF THE INVENTION

In manufacturing semiconductor devices, owing to the recent demands of increased miniaturization and integration, circuit configuration is getting increasingly finer. Also, according to the requirement of forming a metallic film used for an interconnection layer, a burying layer, and a contact layer etc., with a favorable step coverage, CVD (Chemical Vapor Deposition) has been selected.

For example, a single type plasma CVD is utilized in case of depositing Ti film with CVD to be used as a contact layer. In the single type plasma CVD, semiconductor wafers (hereinafter, wafers) each of which is a substrate to be processed is introduced into a chamber one piece at a time, and plasma is generated using, for example, $TiCl_4$ gas as a source gas and $H_2$ gas as a reduction gas, thereby forming Ti film on the wafer disposed on a stage heated to about 400° C.~700° C.

For the deposition of Ti film by the single type plasma CVD, the method includes a step of repeating a cycle in which a precoating process is performed in the chamber, the deposition of Ti film is continuously performed for hundreds to thousands pieces of wafers, and then, a dry cleaning is performed by using, for example, $ClF_3$ gas (for example, see JP Laid Open No. 2007-165479).

Recently, since a fine patterning process is performed in an etching process prior to the Ti film forming process by the plasma CVD, polymer base (C—F base) residue during the etching process may be remained at the periphery portion (near the bevel) of the back side of the wafer. Also, since the ashing process and the wet cleaning process are performed with a single wafer type, these processes may not be performed sufficiently for the back side of the wafer and the wafer is introduced into the Ti film forming chamber with the polymer residue at the back side of the wafer. The polymer residue at the back side of the wafer are adhered to the high temperature susceptor (specifically to the portion corresponding to the wafer periphery) serving as the wafer stage, and be thickened during the repeated operation of the Ti film forming process, thereby making a microgap between the wafer and the wafer stage. When the high frequency electric power is applied to generate plasma at this state, an abnormal discharge may occur at an area where the microgap is produced, and there is concern that troubles in products or damage in stage may occur.

SUMMARY OF THE INVENTION

An object of the present invention is to provide a method of depositing metallic film in which an abnormal discharge between a substrate to be processed and a stage can be suppressed. Another object of the present invention is to provide a storage medium that stores a program performing the method.

According to the first aspect of the present invention, there is provided a method of depositing a metallic film by plasma CVD using a film forming apparatus including a chamber configured to receive a substrate to be processed, a stage configured to dispose the substrate to be processed in the chamber, a heater configured to heat the substrate to be processed on the stage, a gas supply device configured to supply process gas for film deposition and cleaning gas into the chamber, a plasma generating device configured to generate plasma of the process gas in the chamber, and an evacuation device configured to evacuate the inside of the chamber. And, the method comprises, forming a conductive precoat film inside the chamber, the precoat film including a metal which forms the metallic film; depositing the metallic film by the plasma CVD for a plurality of substrates to be processed in which a depositing step for each of the plurality of substrates to be processed includes disposing a substrate to be processed on the stage by introducing the substrate to be processed into the chamber after the precoating, generating plasma of the process gas by supplying the process gas into the chamber while heating the substrate to be processed by the heater, and depositing the metallic film by the plasma CVD; dry cleaning the chamber by introducing the cleaning gas into the chamber, after the film deposition process for the plurality of substrates to be processed has been completed; repeating the steps of forming, depositing, and dry cleaning; and forming a conductive film on the stage one or more times during the course of the depositing process of the metallic film for the plurality of substrates to be processed.

For the first aspect, the formation of the precoat film may be performed by repeating the step of forming a film that includes a metal which forms the metallic film, and the step of performing a nitriding process to the film plural times. And, the formation of the conductive film may refer to forming a film that includes a metal which forms the metallic film.

Also, for the first aspect, the formation of the conductive film may be performed in the film deposition process for every predetermined number of substrates. In this case, it is preferred that the formation of the conductive film is performed in the film deposition process for every 1 piece to 250 pieces of substrates, and is more preferred that the formation of the conductive film is performed in the film deposition process for every 1 lot, for example, 25 pieces of substrates.

Moreover, the metallic film may be formed by any one of Ti, TiN, W, WN, Ta and TaN.

According to a second aspect of the present invention, there is provided a storage medium that stores a program which operates on a computer to control a film forming apparatus that includes a chamber configured to receive a substrate to be processed, a stage configured to dispose the substrate to be processed in the chamber, a heater configured to heat the substrate to be processed on the stage, a gas supply device configured to supply a process gas for film deposition and a cleaning gas into the chamber, a plasma generating device configured to generate plasma of the process gas in the chamber, and an evacuation device configured to evacuate the inside of the chamber. The program, when executed, repeatedly conducts steps of forming a conductive precoat film inside the chamber where the precoat film includes a metal which forms the metallic film; depositing the metallic film by the plasma CVD for a plurality of substrates to be processed in which a depositing step for each of the plurality of substrates to be processed includes disposing a substrate to be processed on the stage by introducing the substrate to be processed into the chamber after the precoating, generating plasma of the process gas by supplying the process gas into the chamber while heating the substrate to be processed by the heater, and depositing the metallic film by the plasma CVD; dry cleaning the chamber by introducing the cleaning gas into the chamber, after the film deposition process for the plurality of substrates to be processed has been completed; repeating the steps of forming, depositing, and dry cleaning; and forming a conductive film on the stage one or more times during the course of the depositing process of the metallic film for the plurality of substrates to be processed.

According to the present invention, a process for performing the deposition of the metallic film for plural pieces of substrates to be processed includes a step of forming the conductive film in the chamber one or more times. Thus, an abnormal discharge between the substrate and a stage may be suppressed because the formed conductive film makes the electrical charge in the substrate to flow into the stage even when the polymer gets accumulated on the stage area corresponding to the periphery portion of the substrate.

DETAILED DESCRIPTION OF INVENTION

Figure 1:
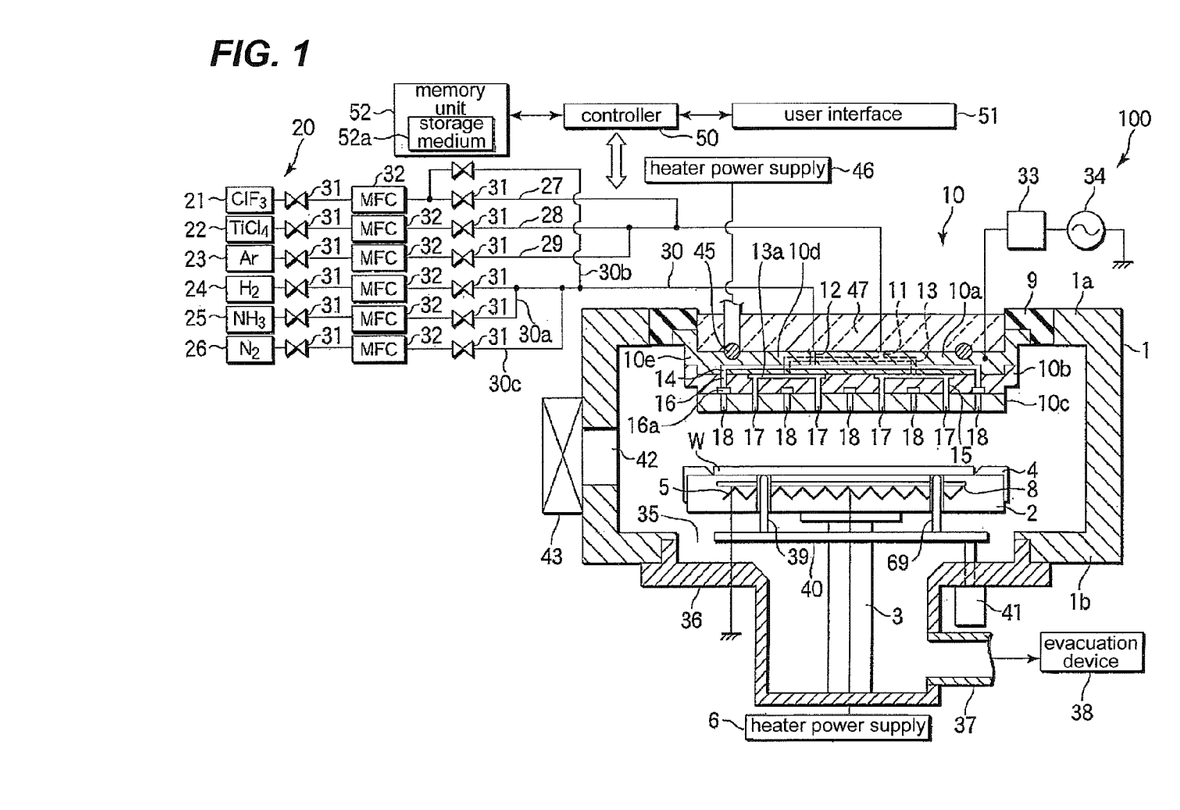
FIG. 1 is a cross sectional view of a film deposition apparatus which is used to perform a method of depositing metallic film, according to an exemplary embodiment of the present invention.

Hereinafter, embodiments of the present invention will be described specifically with reference to the attached drawings. FIG. 1 is a cross sectional view of a film deposition apparatus device which is used to perform the method of depositing a metallic film, according to an exemplary embodiment of the present invention. Here, a case of depositing Ti film by plasma CVD is described as an example.

Also, for the description hereinafter, while ml/min is used for the unit of gas flow rate, a value which is converted to a standard state is used in the present invention because the volume of gas varies extensively according to the temperature and the air pressure. Further, sccm is written in parallel because the gas flow rate converted to the standard state is represented by sccm (Standard Cubic Centimeter per Minutes) in general. The standard state in the description refers to a state of 0° C. (273.15 K) of temperature and 1 atm (101325 Pa) of air pressure.

A film deposition apparatus 100 is configured as a plasma CVD-Ti film deposition apparatus which deposits Ti film by CVD while generating plasma by forming a high frequency electric field at a parallel plate electrode.

Film deposition device 100 has a chamber 1 of an approximately cylindrical shape. A susceptor 2 formed of AlN is disposed inside chamber 1 supported by a supporting member 3 of a cylindrical shape installed at the center of the bottom portion of chamber 1, and susceptor 2 is a stage for horizontally supporting the wafer W which is a substrate to be processed. A guide ring 4 for guiding the wafer W is installed at the outside of the peripheral edge of susceptor 2. Also, susceptor 2 includes a heater 5 embedded therein and formed with a high melting point metal such as molybdenum, and heater 5 heats the wafer W which is a substrate to be processed to a predetermined temperature when the power is supplied by a heater power supply 6. Electrode 8 which functions as a bottom electrode of the parallel plate electrode is installed near the surface of susceptor 2, and electrode 8 is electrically grounded.

At an upper wall 1a of chamber 1, a shower head 10 which also functions as an upper electrode of a parallel plate electrode is installed through an insulating member 9. Shower head 10 is configured with an upper block body 10a, a center block body 10b and a bottom block body 10c, and shower head 10 thereby forming a disk shape. Upper block body 10a includes a horizontal area 10d which forms the main body of the shower head along with center block body 10b and bottom block body 10c, and a ring shaped supporting area 10e extended to the top side of the outer periphery of horizontal area 10d, thereby forming a concave shape. The entire shower head 10 is supported by ring shaped supporting area 10e. And, discharge holes 17, 18 are formed alternately at bottom block body 10c to discharge the gas. A first gas introduce hole 11 and a second gas introduce hole 12 are formed at the top surface of upper block body 10a. Inside upper block body 10a, a plurality of gas paths 13 are diverged from first gas introduce hole 11. A gas path 15 is formed at center block body 10b, and gas path 13 is connected to gas path 15 through a connection path 13a which is extended horizontally. Also, gas path 15 is connected to discharge hole 17 of bottom block body 10c. And inside upper block body 10a, a plurality of gas paths 14 are diverged from second gas introduce hole 12. A gas path 16 is formed at center block body 10b, and gas path 14 is connected to gas path 16. And, gas path 16 is connected to a connection path 16a which is extended horizontally inside center block body 10b, and connection path 16a is connected to plurality of discharge holes 18 of bottom block body 10c. Further, first and second gas introduce holes 11, 12 are connected to the gas line of a gas supply apparatus 20.

Gas supply apparatus 20 includes a ClF$_3$ gas supply source 21 which supplies ClF$_3$ gas as a cleaning gas, a TiCl$_4$ gas supply source 22 which supplies TiCl$_4$ gas as a Ti compound gas, an Ar gas supply source 23 which supplies Ar gas, a H$_2$ gas supply source 24 which supplies H$_2$ gas as a reduction gas, a $NH_3$ gas supply source 25 which supplies $NH_3$ gas as a nitriding gas, and a $N_2$ gas supply source 26 which supplies $N_2$ gas. Also, $ClF_3$ gas supply lines 27, 30b are connected to $ClF_3$ gas supply source 21, $TiCl_4$ gas supply line 28 is connected to $TiCl_4$ gas supply source 22, Ar gas supply line 29 is connected to Ar gas supply source 23, $H_2$ gas supply line 30 is connected to $H_2$ gas supply source 24, $NH_3$ gas supply line 30a is connected to $NH_3$ gas supply source 25, and $N_2$ gas supply line 30c is connected to $N_2$ gas supply source 26, respectively. Moreover, mass flow controller 32 and two valves 31 putting mass flow controller 32 between them are installed at each of the gas line.

$TiCl_4$ gas supply line 28 extending from $TiCl_4$ gas supply source 22 is connected to first gas introduce hole 11, and $ClF_3$ gas supply line 27 extending from $ClF_3$ gas supply source 21 and Ar gas supply line 29 extending from Ar gas supply source 23 are connected to $TiCl_4$ gas supply line 28. Also, $H_2$ gas supply line 30 extending from $H_2$ gas supply source 24 is connected to second gas introduce hole 12. $NH_3$ gas supply line 30a extending from $NH_3$ gas supply source 25, $N_2$ gas supply line 30c extending from $N_2$ gas supply source 26 and $ClF_3$ gas supply line 30b extending from $ClF_3$ gas supply source 21 are connected to $H_2$ gas supply line 30. Thus, in a process, $TiCl_4$ gas from $TiCl_4$ gas supply source 22 together with Ar gas from Ar gas supply source 23 pass through $TiCl_4$ gas supply line 28 and reach into shower head 10 from first gas introduce hole 11 of shower head 10. And $TiCl_4$ gas and Ar gas pass through gas paths 13, 15 and are discharged into chamber 1 by discharge hole 17. In the mean time, $H_2$ gas from $H_2$ gas supply source 24 passes through $H_2$ gas supply line 30 and reaches into shower head 10 from second gas introduce hole 12 of shower head 10. And $H_2$ gas passes through gas path 14, 16 and is discharged into chamber 1 by discharge hole 18. That is, shower head 10 is configured as a post mix type which supplies $TiCl_4$ gas and $H_2$ gas into chamber 1 in a completely independent manner, so that $TiCl_4$ gas and $H_2$ gas are combined and react after they are discharged. Besides, shower head 10 is not limited to the post mix type, and may be configured as a pre mix type which mixes $TiCl_4$ gas and $H_2$ gas inside shower head 10 and supplies into chamber 1.

High frequency power source 34 is connected to shower head 10 through a matching device 33, and high frequency power is supplied to shower head 10 from high frequency power source 34. By supplying the high frequency power from high frequency power source 34, gas supplied into chamber 1 through shower head 10 becomes plasma and the film deposition process is performed.

Moreover, a heater 45 for heating shower head 10 is disposed at horizontal area 10d of upper block body 10a of shower head 10. A heater power supply 46 is connected to heater 45 to supply the power to heat shower head 10 to a desired temperature. A heat insulating member 47 is disposed at the concave area of upper block body 10a to improve the heating efficiency by heater 45.

A circular hole 35 is formed at the central area of bottom wall 1b of chamber 1, and an evacuation room 36 is provided covering circular hole 35 and protruding toward a downward direction. An evacuation pipe 37 is connected at the side surface of evacuation room 36 and an evacuation device 38 is connected to evacuation pipe 37. Also, the pressure of the inside of chamber 1 may be reduced to a predetermined vacuum level by operating evacuation device 38.

Three (only two are shown in FIG. 1) wafer support pins 39 are provided at susceptor 2 in such a way that the support pins can protrude and descend thereby supporting and elevating the wafer W, and wafer support pins 39 are supported by a support plate 40. And, wafer support pins 39 supported by support plate 40 are elevated by a driving device 41 such as an air cylinder.

At the side wall of chamber 1, carry in/out port 42 is provided for carrying in/out the wafer W between chamber 1 and a wafer transfer room (not shown) which is disposed adjacent to chamber 1, and gate valve 43 is provided to open and close carry in/out port 42.

The components that form film deposition apparatus 100 including, for example, heater power supply 6, 46, valve 31, mass flow controller 32, matching device 33, high frequency power supply 34 and driving device 41 are connected to a controller 50 which includes a microprocessor (computer), and are controlled by controller 50. And, a user interface 51 such as a keyboard for an operator to perform an input operation of a command for managing film deposition apparatus 100, or a display which visualize and display the operating condition of film deposition apparatus 100 is connected to controller 50. Also, a memory unit 52 that stores a recipe is connected to controller 50, where the recipe is, for example, a program for realizing various processes performed by film deposition apparatus 100 by the control of controller 50, or a program for making each components of film deposition apparatus 100 to perform processes according to the process condition. The recipe is stored in a storage medium 52a inside memory unit 52. Storage medium 52a may be a fixed one such as a hard disk, or a portable one such as a CDROM or a DVD. Also, the recipe may be transmitted from other devices by, for example, a dedicated line. And, if needed, a necessary recipe may be called from memory unit 52 by a command from user interface 51 and performed the recipe in controller 50, thereby performing a desired process at film deposition device 100 under the control of controller 50.

Figure 2:
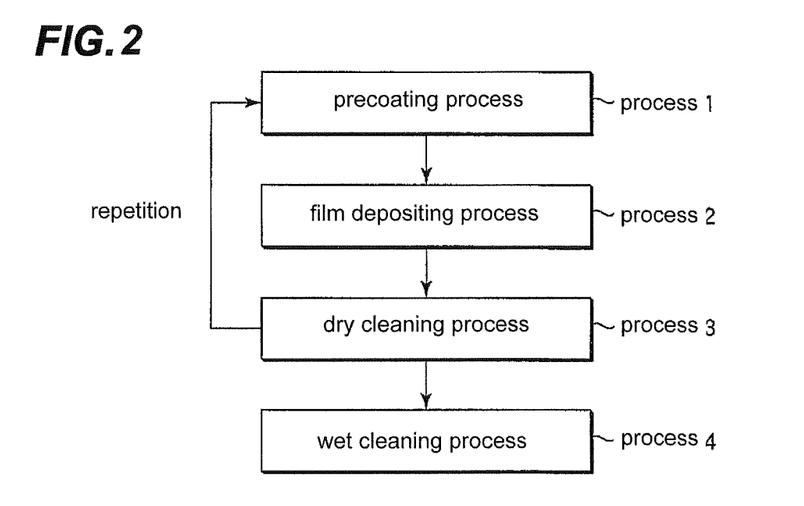
FIG. 2 is a flow chart showing the process of Ti film deposition.

Next, an explanation will be given of a Ti film deposition method according to the present embodiment performed by film deposition apparatus 100 as described above. In the present embodiment, as shown in FIG. 2, precoating process (process 1), film deposition process (process 2) and dry cleaning process (process 3) are repeated for a predetermined number of times, and wet cleaning process (process 4) is performed after the repeating.

According to the precoating process of process 1, the precoat film is formed inside chamber 1 by repeating the deposition of Ti film and nitriding process a plurality of times with no wafer carried into chamber 1.

According to the film deposition process of process 2, after the precoating is completed as described above, the Ti film deposition and the nitriding process are performed in chamber 1 for plural pieces of wafers W, preferably no more than 3000 pieces, for example 500 pieces of wafers W.

According to the dry cleaning process of process 3, under the condition that a wafer is not existing in chamber 1, $ClF_3$ gas is introduced into chamber 1 and a dry cleaning process is performed. Dry cleaning is performed by heating susceptor 2 by heater 5, and the temperature during the dry cleaning is preferably 170° C.~250° C. Besides, other fluorinated gases such as $NF_3$, $F_2$ than $ClF_3$ may be used in the dry cleaning process.

According to the wet cleaning process of process 4, the inside of chamber 1 is wet cleaned by chemicals such as ammonia at a time when the processes 1~3 are repeated for a predetermined number of times so that the accumulated pieces of substrates that are processed become predetermined pieces, for example, 5000~30000 pieces.

Next, specific explanation will be given about the process 1 and the process 2. In the precoating process of process 1, with no wafer being carried into chamber 1, the inside of chamber 1 is evacuated by evacuation device 38. And while Ar gas and N$_2$ gas are introduced into chamber 1, the temperature of susceptor 2 is elevated by heater 5. At the time when the temperature of susceptor 2 is stabilized to a predetermined temperature, TiCl$_4$ gas is introduced with a predetermined flow rate, and Ar gas, H$_2$ gas and TiCl$_4$ gas introduced into chamber 1 become plasma by applying the high frequency power from high frequency power supply 34. Thus, Ti film is formed at the inside wall of chamber 1, the inside wall of evacuation room 36, shower head 10 and susceptor 2. Subsequently, the supply of only TiCl$_4$ gas is stopped, and NH$_3$ gas as a nitriding gas is made to be flowing into chamber 1. And, by applying the high frequency power at shower head 10 and making plasma of these gases, Ti film is nitrided. Ti film deposition and nitriding as above are repeated for plural times, for example, 33 times to form the precoat film. Also, Ti film of a predetermined thickness may be formed without performing the nitriding process.

Preferable conditions of the precoating process are as follows.

(1) Forming Ti Film
  i) High frequency power from high frequency power supply 34
    Frequency: 300 kHz~27 MHz
    Power: 100 W~1500 W
  ii) Gas flow rate of TiCl$_4$ gas: 1~20 ml/min (sccm)
  iii) Gas flow rate of Ar gas: 100~2000 ml/min(sccm)
  iv) Gas flow rate of H$_2$ gas: 250~5000 ml/min (sccm)
  v) Pressure inside the chamber: 440~4333 Pa (3~10 Torr)
(2) Nitriding Process
  i) High frequency power from high frequency power supply 34
    Frequency: 300 kHz~27 MHz
    Power: 400 W~1500 W
  ii) Gas flow rate of NH$_3$ gas: 100~2000 ml/min (sccm)
  iii) Gas flow rate of Ar gas: 100~2000 ml/min (sccm)
  iv) Gas flow rate of H$_2$ gas: 250~5000 ml/min (sccm)
  v) Pressure inside the chamber: 440~1333 Pa (3~10 Torr)

In the film deposition process of process 2, after the precoating is completed as described above, Ti film deposition and nitriding process are performed in chamber 1 for the wafer W as described below.

The deposition of the Ti film is performed by elevating the temperature of susceptor 2 to a predetermined temperature by heater 5 in advance, and then controlling the inside of chamber 1 to have the same atmosphere as the outside atmosphere connected through gate valve 43. Gate valve 43 is then opened to carry the wafer W into chamber 1 through carry in/out port 42 from a wafer transfer room (not shown) which has a vacuum condition. Subsequently, like the similar procedure that forms the Ti film at shower head 10 in the precoating process, Ar gas, H$_2$ gas and TiCl$_4$ gas introduced into chamber 1 become plasma and then are reacted thereby depositing the Ti film of a predetermined thickness on the wafer W.

In the nitriding process after the deposition of the Ti film is completed, the supply of TiCl$_4$ gas stops, and H$_2$ gas and Ar gas are made to flow, and the inside of chamber 1 (for example, chamber wall or shower head surface) is heated to an appropriate temperature. NH$_3$ gas as a nitriding gas is then made to flow, and the process gases become plasma by applying the high frequency power from high frequency power supply 34 to shower head 10. As a result, the surface of the Ti film formed on the wafer W is nitrided by the plasma of the process gas. Also, the nitriding process is not essential.

Preferable condition of the film deposition process is as follows.

(1) Deposition of Ti Film
  i) High frequency power from high frequency power supply 34
    Frequency: 300 kHz~27 MHz
    Power: 100 W~1500 W
  ii) Temperature of susceptor 2 by heater 5: 500° C.~700° C.
  iii) Temperature of shower head 10 by heater 45: 300° C.~500° C.
  iv) Gas flow rate of TiCl$_4$ gas: 1~20 ml/min (sccm)
  v) Gas flow rate of Ar gas: 100~2000 ml/min (sccm)
  vi) Gas flow rate of H$_2$ gas: 250~5000 ml/min (sccm)
  vii) Pressure inside the chamber: 440~1333 Pa (3~10 Torr)
(2) Nitriding Process
  i) High frequency power from high frequency power supply 34
    Frequency: 300 kHz~27 MHz
    Power: 100 W~1500 W
  ii) Temperature of susceptor 2 by heater 5: 500° C.~700° C.
  iii) Temperature of shower head 10 by heater 45: 300° C.~500° C.
  iv) Gas flow rate of NH$_3$ gas: 100~2000 ml/min (sccm)
  v) Gas flow rate of Ar gas: 100~2000 ml/min (sccm)
  vi) Gas flow rate of H$_2$ gas: 250~5000 ml/min (sccm)
  vii) Pressure inside the chamber: 440~1333 Pa (3~10 Torr)

Figure 3:
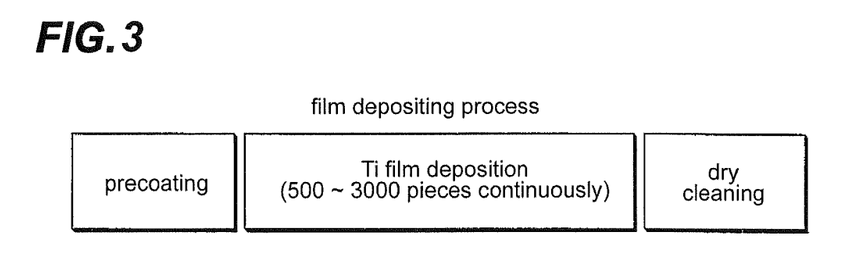
FIG. 3 is a view showing a conventional method of film deposition.

In the conventional method, as shown in FIG. 3, the Ti film deposition process has been performed continuously for, for example, 500~3000 pieces of wafers W, and then the dry cleaning process has been performed. However, by this method, there are cases that the abnormal discharge occurs as more and more wafers W are processed, and this abnormal discharge increases its frequency while repeating the Ti film deposition process between the dry cleaning processes. Especially, when the accumulated number of wafers W that are processed from the wet cleaning is 3000~5000 pieces, the occurrence of the abnormal discharge becomes noticeable.

The abnormal discharge is occurred when the polymer residue, adhered along the peripheral edge of the backside of the wafer W to the bevel area of the wafer W, adheres to susceptor 2 of high temperature at an area which corresponds to the peripheral edge of the wafer W. And as the number of pieces processed is increased, as shown in FIG. 4, the polymer residue is accumulated and a gap between the wafer W and susceptor 2 is formed, thereby generating the abnormal discharge.

Figure 4:
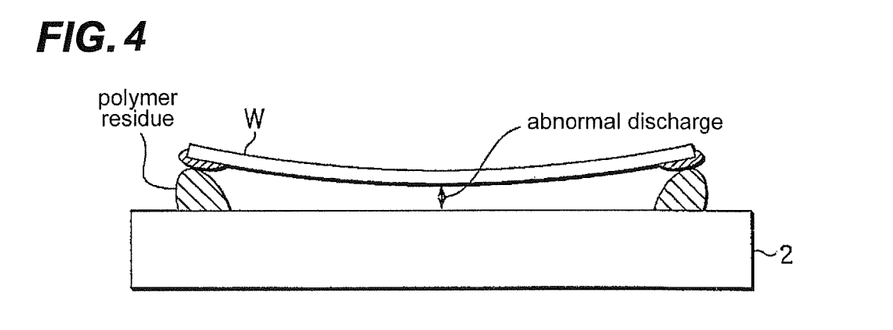
FIG. 4 is a view showing a mechanism in which an abnormal discharge is occurred between a wafer and a susceptor.

That is, since the polymer residue is an insulator, as shown in FIG. 4, when the gap between the wafer W and susceptor 2 is made by the accumulation of the polymer residue at susceptor 2, electrical charge supplied from the plasma to the wafer W does not flow through susceptor 2. Therefore, when the wafer W is charged to a specific level, a discharging phenomenon occurs to susceptor 2. The polymer residue accumulates on the area of susceptor 2 corresponding to the peripheral edge of the wafer W, and the wafer W supported by the polymer residue accumulated on the peripheral edge of susceptor 2 bents downward. Especially, since the discharge may occur in the closest distance by Paschen's law, the abnormal discharge may easily occur near the central area of the wafer W.

Accumulation of the polymer residue continues after the dry cleaning since the polymer residue is hardly removed by the dry cleaning by ClF$_3$ gas. And, as the accumulated number of pieces of the wafer W which have been performed wet cleaning approaches to 5000 pieces, the occurrence of the abnormal discharge becomes noticeable.

Figure 5:
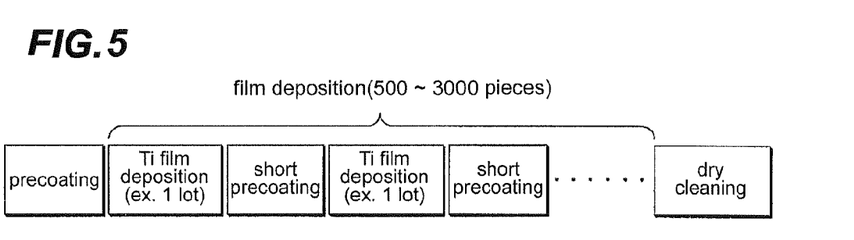
FIG. 5 illustrates the method of film deposition according to one embodiment of the present invention.
Figure 6:
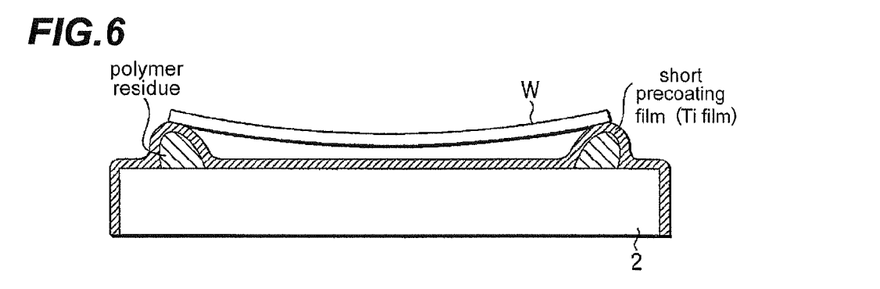
FIG. 6 illustrates the effect of the conductive film which is used in a method of depositing film according to the present invention.

Therefore, in the present embodiment, a conductive film is formed between the Ti film depositions of predetermined pieces of wafers W, for example 500~3000 pieces, and preferably 1~250 pieces of wafers W. Specifically, as shown in FIG. 5, for every predetermined pieces of wafers, for example 1 lot (for example, 25 pieces), a short precoating is performed in which a Ti film depositing process and a nitriding process are performed continuously in chamber 1. Thus, as shown in FIG. 6, the conductive Ti film is deposited on the surface of the accumulated polymer residue which is insulative as well as on the surface of susceptor 2. Therefore, the accumulated charge on the wafer W can be discharged (earthed) to susceptor 2 through the Ti film when the wafer W is located on susceptor 2 thereby suppressing the discharge between the wafer W and susceptor 2.

That is, when the deposition of the Ti film is continuously performed for 500~3000 pieces of the wafers W, the insulative polymer residue continuously accumulates on susceptor 2 and becomes thick. As a result, the possibility of the wafer W to contact the conductive film reduces, and it becomes difficult for the electric charge stored in the wafer W to be released thereby increasing the chance of the abnormal discharge to be occurred. However, as in the present embodiment, the conductive film is formed in the course of the Ti film deposition of for example, 500~3000 pieces of the wafers W, and the possibility of releasing the electrical charges from the wafer W to susceptor 2 is increased when the wafer W is loaded on susceptor 2. As a result, the possibility of the abnormal discharge to be occurred becomes distinguishably reduced. Also, the short precoating may be performed without the nitriding process, to form the Ti film of a predetermined thickness.

Preferable conditions of the short precoating are as follows.
(1) Formation of the Ti Film
  i) High frequency power from high frequency power supply 34
    Frequency: 300 kHz~27 MHz
    Power: 100 W~1500 W
  ii) Gas flow rate of $TiCl_4$ gas: 1~20 ml/min (sccm)
  iii) Gas flow rate of Ar gas: 100~2000 (sccm)
  iv) Gas flow rate of $H_2$ gas: 250~5000 ml/min (sccm)
  v) Pressure inside the chamber: 440~4333 Pa (3~10 Torr)
(2) Nitriding Process
  i) High frequency power from high frequency power supply 34
    Frequency: 300 kHz~27 MHz
    Power: 400 W~1500 W
  ii) Gas flow rate of $NH_3$ gas: 100~2000 ml/min (sccm)
  iii) Gas flow rate of Ar gas: 100~2000 ml/min (sccm)
  iv) Gas flow rate of $H_2$ gas: 250~5000 ml/min (sccm)
  v) Pressure inside the chamber: 440~1333 Pa (3~10 Torr)

In view of preventing the abnormal discharge, the frequency of forming the conductive film is better to be often. However, since the throughput of the film deposition process for the wafers W reduces when the frequency is too often, the frequency of forming the conductive film may be controlled appropriately between the abnormal discharge preventing effect and the throughput. And, since the abnormal discharge does not easily occur in the initial stage of the film deposition because the accumulation of the polymer residue is little in the initial stage, the Ti film deposition process may be performed in succession for, for example, 100~200 pieces of wafers W at first, and then the formation of the conductive film (short precoating) may be performed. And then, the formation of the conductive film may be performed for every 1 lot of 25 pieces of the wafers W.

Figure 7:
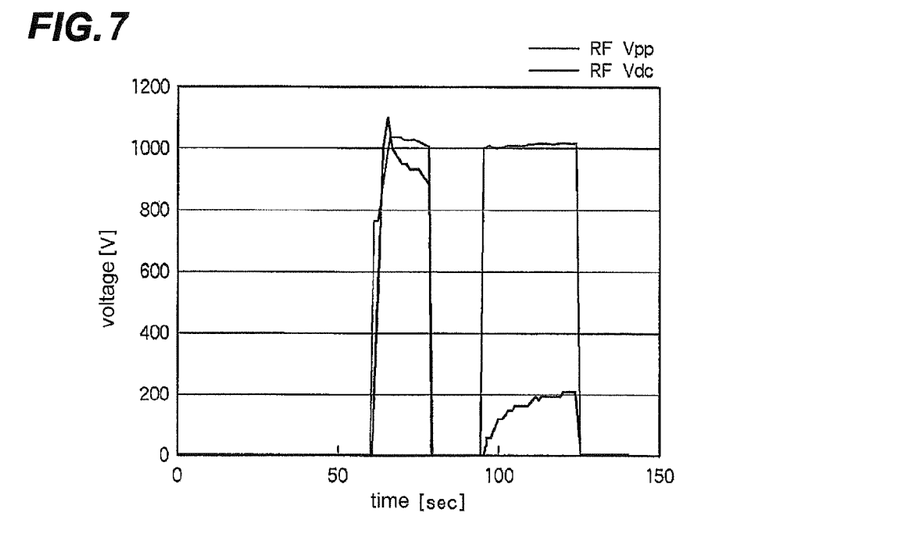
FIG. 7 is a view showing Vdc and Vpp of plasma in a normal case.
Figure 8:
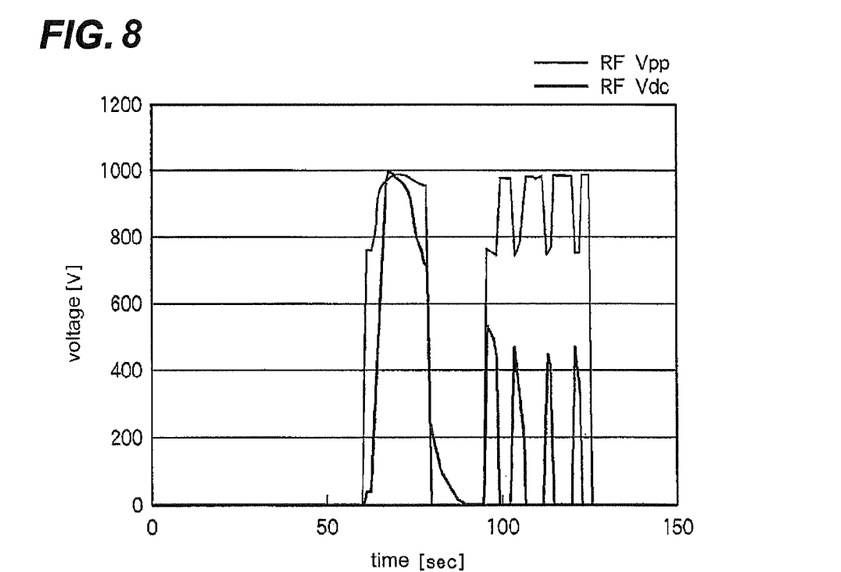
FIG. 8 is a view showing Vdc and Vpp of plasma when an abnormal discharge is occurring.

Next, descriptions will be made for an experimental result performed about the possibility of the occurrence of the abnormal discharge during the Ti film deposition for a plurality of wafers under variety of conditions. In the experiment, as an index of the abnormal discharge, DC bias voltage (Vdc) of electrode 8 which functions as a lower electrode of the parallel plate electrode for generating plasma is used. That is, in general case, as shown in FIG. 7, while Vdc is stable when forming the Ti film, Vdc varies and becomes unstable when an arcing (abnormal discharge) occurs between the wafer and the susceptor as shown in FIG. 8. Therefore, the occurrence of the abnormal discharge or an abnormal symptom for the occurrence of the abnormal discharge may be understood by monitoring the behavior of Vdc. Moreover, as shown in FIG. 8, since the peak-to-peak voltage (Vpp) of the high frequency power varies when an arcing has occurred, Vpp may also be used as an index for the abnormal discharge.

Figure 9:
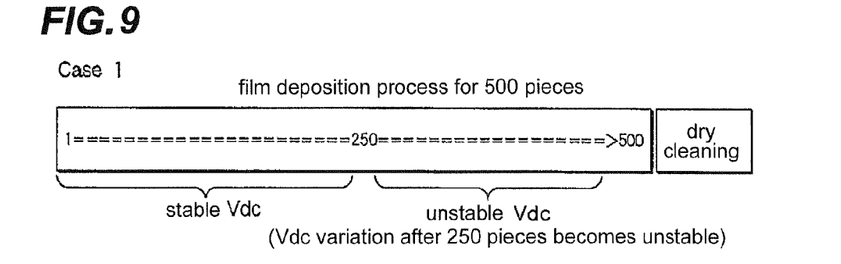
FIG. 9 is a view showing the condition of depositing Ti film and the status of Vdc of case 1 using a conventional method.

Case 1 shown in FIG. 9 is a conventional method performing a continuous film deposition process (Ti deposition+nitriding process) for 500 pieces of wafers W after the precoating, and then performing the dry cleaning process. As shown in FIG. 9, it is confirmed that the Vdc variation after 250 pieces of the wafers W is unstable, and the abnormal discharge may easily occur.

Figure 10:
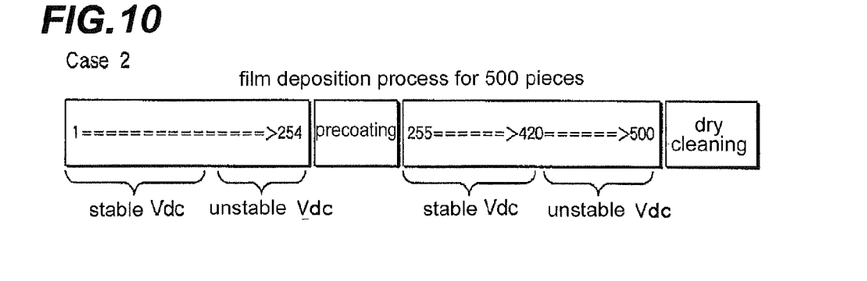
FIG. 10 is a view showing the condition of depositing Ti film and the status of Vdc of case 2 in which a precoating process is added after the change in Vdc occurs (after film deposition of 254 pieces of substrates).

Therefore, in case 2 as shown in FIG. 10, the precoating process has been added after the Vdc variation occurred (after the film deposition of 254 pieces). And as a result, Vdc has been temporarily stabilized. That is, it is confirmed that performing the precoating process to form the conductive film on susceptor 2 in the course of repeating the film deposition process for a plurality of wafers W is effective for preventing the abnormal discharge. However, after the precoating process, Vdc becomes unstable again when the processed pieces of the wafers W are about 420 pieces, which proves that performing the precoating process after 250 pieces of film deposition is not enough for preventing the abnormal discharge.

Figure 11:
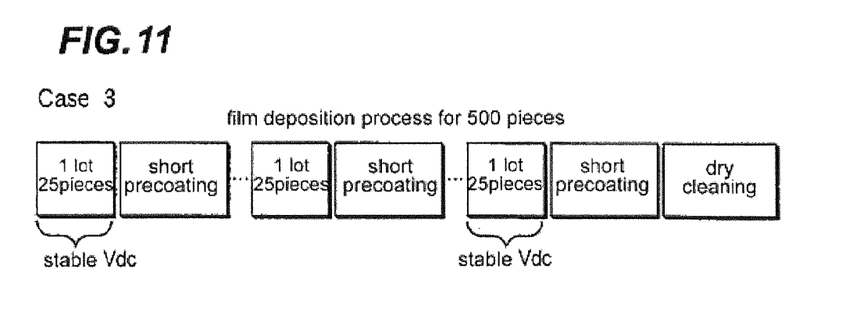
FIG. 11 is a view showing the condition of depositing Ti film and the status of Vdc of case 3 in which a short precoating process is added in the film deposition process for every 1 lot of 25 pieces of wafers.

Next, in case 3 as shown in FIG. 11, the short precoating (1 layer of Ti film+nitriding process) has been performed in the film deposition process (Ti deposition+nitriding process) for every 1 lot of 25 pieces of the wafers W. As a result, Vdc is stable even when the accumulated number of pieces of the wafers W processed is 500 pieces, and it is confirmed that no abnormal discharge occurs.

Figure 12:
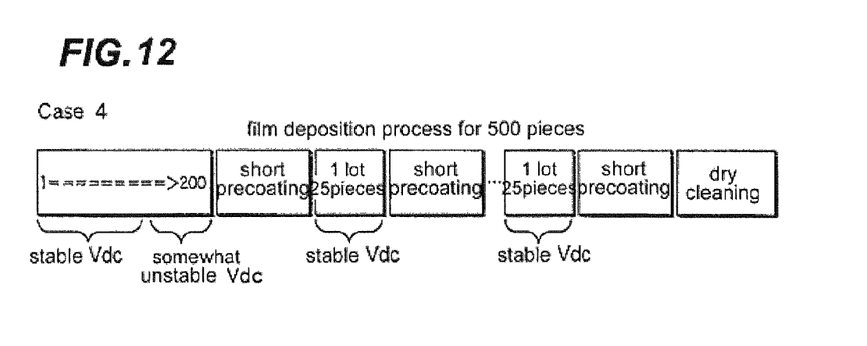
FIG. 12 is a view showing the condition of depositing Ti film and the status of Vdc of case 4 in which a short precoating process is performed after the film deposition process for first 200 pieces of wafers, and then a short precoating process is performed in the film deposition process for every 1 lot of 25 pieces of wafers.

Next, in case 4 as shown in FIG. 12, the film deposition process has been performed for the first 200 pieces of the wafers W, and then the short precoating has been performed, and then the short precoating has been performed in the film deposition process for every 1 lot of 25 pieces of wafers W. As a result, although the occurrence of the abnormal discharge may not be completely prevented since Vdc becomes somewhat unstable at the end part of the film deposition process of the first 200 pieces, Vdc becomes stable after that and it is confirmed that no abnormal discharge occurs.

From the above results, it is confirmed that the abnormal discharge may be clearly prevented by performing the short precoating process in the film deposition process preferably for every 250 pieces of the wafers W or less, and more preferably in the film deposition process for every 1 lot of 25 pieces of the wafers W. That is, it is confirmed that the formation of the conductive film is preferably performed for every 1~250 pieces of the wafers, and more preferably performed for every 25 pieces of the wafers.

And, the film deposition condition for the wafers W (Ti film deposition+nitriding process) and the short precoating condition are as follows.

(1) Film Deposition Condition
<Ti Film Deposition>
i) High frequency power from high frequency power supply 34
Frequency: 450 kHz
Power: 800 W
ii) Gas flow rate of $TiCl_4$ gas: 12 ml/min (sccm)
iii) Gas flow rate of Ar gas: 1600 ml/min (sccm)
iv) Gas flow rate of $H_2$ gas: 4000 ml/min (sccm)
v) Pressure inside the chamber: 666.7 Pa (5 Torr)
<Nitriding Process>
i) High frequency power from high frequency power supply 34
Frequency: 450 kHz
Power: 800 W
ii) Gas flow rate of $NH_3$ gas: 1500 ml/min (sccm)
iii) Gas flow rate of Ar gas: 1600 ml/min (sccm)
iv) Gas flow rate of $H_2$ gas: 2000 ml/min (sccm)
v) Pressure inside the chamber: 666.7 Pa (5 Torr)
(2) Short Precoating Condition
<Ti Film Deposition>
i) High frequency power from high frequency power supply 34
Frequency: 450 kHz
Power: 800 W
ii) Gas flow rate of $TiCl_4$ gas: 18 ml/min (sccm)
iii) Gas flow rate of Ar gas: 1600 ml/min (sccm)
iv) Gas flow rate of $H_2$ gas: 3000 ml/min (sccm)
v) Pressure inside the chamber: 666.7 Pa (5 Torr)
<Nitriding Process>
i) High frequency power from high frequency power supply 34
Frequency: 450 kHz
Power: 800 W
ii) Gas flow rate of $NH_3$ gas: 1500 ml/min (sccm)
iii) Gas flow rate of Ar gas: 1600 ml/min (sccm)
iv) Gas flow rate of $H_2$ gas: 2000 ml/min (sccm)
v) Pressure inside the chamber: 666.7 Pa (5 Torr)

Moreover, the present invention is not limited to the embodiments described above, and can be modified into various aspects. For example, although only the aspect for forming the Ti film as a metallic film has been described in the above embodiments, the above embodiments can be applied to other metallic films such as TiN, W, WN, Ta and TaN. Also, in the above embodiments, while forming the conductive film is shown by performing the short precoating in the course of the film deposition process, it is not limited thereto, and the method itself may not be important as long as the conductive film can be precoated on susceptor 2 (stage). Also, in the above embodiments, plasma has been formed by applying the high frequency power to the shower head. However, it is not limited thereto. Also, for a substrate to be processed, it is not limited to the semiconductor wafer, and the substrate to be processed may be a substrate for liquid crystal display (LCD) devices, a glass substrate, a ceramic substrate and so on.

What is claimed is:

1. A method of depositing a metallic film by plasma CVD using a film forming apparatus including a chamber configured to receive a substrate to be processed, a stage configured to dispose the substrate to be processed in the chamber, a heater configured to heat the substrate to be processed on the stage, a gas supply device configured to supply a process gas for a film deposition and a cleaning gas into the chamber, a plasma generating device configured to generate plasma of the process gas in the chamber, and an evacuation device configured to evacuate inside of the chamber, the method comprising:

forming a conductive precoat film on the stage inside the chamber, the precoat film including a metal which forms the metallic film;

depositing the metallic film by the plasma CVD for a plurality of substrates to be processed sequentially, in which the depositing for each of the plurality of substrates includes:

disposing a substrate to be processed on the stage where the conductive precoat film is formed by introducing the substrate to be processed into the chamber after the precoating, generating plasma of the process gas by supplying the process gas into the chamber while heating the substrate to be processed by the heater, and depositing the metallic film on the substrate by the plasma CVD;

dry cleaning the chamber by introducing the cleaning gas into the chamber, after the film deposition process for the plurality of substrates to be processed has been completed;

repeating the steps of forming the conductive precoat film on the stage, depositing the metallic film by the plasma CVD, and dry cleaning the chamber; and forming a conductive film on the stage one or more times during the course of the depositing process of the metallic film for the plurality of substrates to be processed such that a residual polymer film formed on the stage during the course of the depositing process is covered by the conductive film.

2. The method according to claim 1, wherein the formation of the precoat film is performed by repeating a step of forming a film comprising a metal which forms the metallic film, and a step of performing a nitriding process to the film.

3. The method according to claim 1, wherein the formation of the conductive film includes the formation of a film that includes a metal constituting the metallic film.

4. The method according to claim 1, wherein the formation of the conductive film is performed in the film deposition process for every predetermined pieces of substrates.

5. The method according to claim 4, wherein the formation of the conductive film is performed in the film deposition process for every 1 piece to 250 pieces of substrates.

6. The method according to claim 5, wherein the formation of the conductive film is performed in the film deposition process for every 1 lot of substrates.

7. The method according to claim 1, wherein the metallic film is formed from any one of Ti, TiN, W, WN, Ta and TaN.

8. A storage medium storing a program which operates on a computer, the program controlling a film forming apparatus including a chamber configured to receive a substrate to be processed, a stage configured to dispose the substrate to be processed in the chamber, a heater configured to heat the substrate to be processed on the stage, a gas supply device configured to supply a process gas for a film deposition and a cleaning gas into the chamber, a plasma generating device configured to generate plasma of the process gas in the chamber, and an evacuation device configured to evacuate inside of the chamber, the program, when executed, controls the computer to perform steps of:

forming a conductive precoat film on the stage inside the chamber, the precoat film including a metal which forms the metallic film;

depositing the metallic film by the plasma CVD for a plurality of substrates to be processed sequentially, in which the depositing for each of the plurality of substrates includes:

disposing a substrate to be processed on the stage where the conductive precoat film is formed by introducing the substrate to be processed into the chamber after the precoating, generating plasma of the process gas by supplying the process gas into the chamber while heating the substrate to be processed by the heater, and depositing the metallic film on the substrate by the plasma CVD;

dry cleaning the chamber by introducing the cleaning gas into the chamber, after the film deposition process for the plurality of substrates to be processed has been completed;

repeating the steps of forming the conductive precoat film on the stage, depositing the metallic film by the plasma CVD, and dry cleaning the chamber; and forming a conductive film on the stage one or more times during the course of the depositing process of the metallic film for the plurality of substrates to be processed such that a residual polymer film formed on the stage during the course of the depositing process is covered by the conductive film.

* * * * *